United States Patent [19]

Black et al.

[11] 4,131,862

[45] Dec. 26, 1978

[54] PHASE LOCK LOOP WITH NARROW BAND LOCK-IN AND WIDEBAND ACQUISITION CHARACTERISTICS

[75] Inventors: Stanley H. Black; Jon A. Schneider, both of Phoenix, Ariz.

[73] Assignee: Sperry Rand Corporation, New York, N.Y.

[21] Appl. No.: 841,871

[22] Filed: Oct. 13, 1977

[51] Int. Cl.² ............................................. H03B 3/04
[52] U.S. Cl. ......................................... 331/4; 331/17; 331/25
[58] Field of Search ................... 331/1 A, 4, 17, 18, 331/25

[56] References Cited

U.S. PATENT DOCUMENTS

| | | | |
|---|---|---|---|
| 3,363,194 | 1/1968 | Hileman | 331/17 |
| 4,000,476 | 12/1976 | Walker et al. | 331/17 |
| 4,027,274 | 5/1977 | Fukui et al. | 331/17 X |

*Primary Examiner*—Siegfried H. Grimm

*Attorney, Agent, or Firm*—Howard P. Terry; Seymour Levine

[57] ABSTRACT

A phase lock loop operable with narrow band filtering characteristics in-lock and wideband acquisition characteristics when an out-of-lock condition is detected. The phase lock loop comprises a phase detector coupled to a differential amplifier to which a step ramp voltage is also coupled when an a.c. signal, which indicates an out-of-lock condition, is coupled from the phase detector to an out-of-lock detector. The a.c. signal from the phase detector also causes a switch means to short out a narrow band filter which is serially coupled with a wideband filter between the differential amplifier and a voltage controlled oscillator. The frequency of the voltage controlled oscillator is caused to vary by the a.c. signal until lock-in is achieved at which time, the out-of-lock detector stops and holds the step ramp voltage at the value required to achieve lock and the switch means reintroduces the narrow band filter to the loop. The phase lock loop acquisition characteristics are not limited by the required filtering characteristics.

9 Claims, 1 Drawing Figure

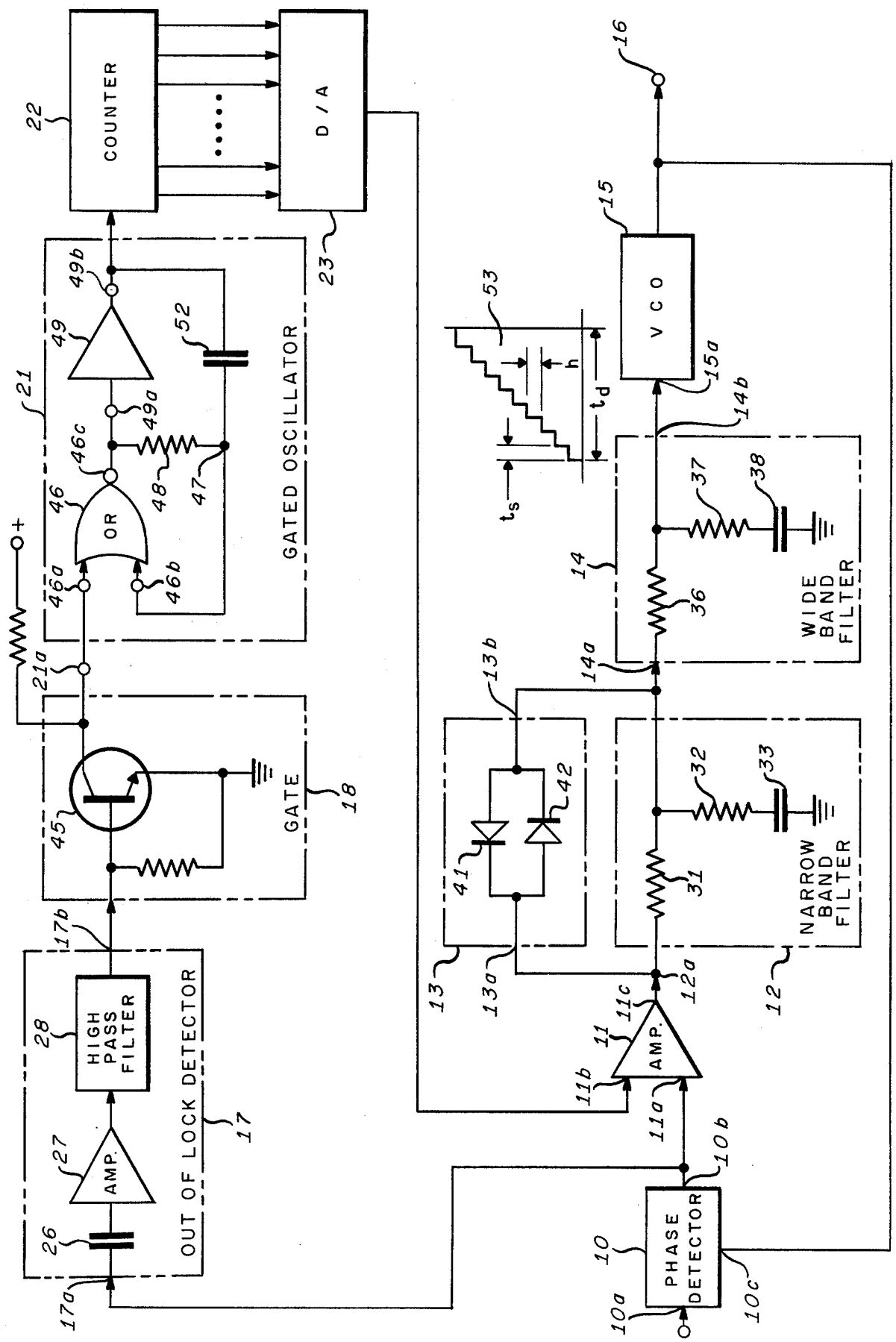

PHASE LOCK LOOP WITH NARROW BAND LOCK-IN AND WIDEBAND ACQUISITION CHARACTERISTICS

BACKGROUND OF THE INVENTION

1. Field of the Invention

The invention relates to phase lock loops and more particularly to a narrow band phase lock loop that possesses a wide input frequency acquisition range.

2. Background of the Invention

Information is transmitted by radio communication systems within frequency channels (bands) about a carrier frequency that is assigned to each channel. These systems require stable frequency sources for the carrier frequency to achieve channel selectivity and a minimum of interchannel interference. At the lower frequencies, i.e., one MHz, this does not pose a serious problem. At these frequencies, oscillators are readily obtainable with stabilities that maintain a selected carrier frequency within a small percentage thereof thus providing an operating frequency range that permits non-interfering channelized communications. At very high frequencies, VHF, (30-300 MHz), however, these same percentage stabilities may provide carrier frequencies in a proportionately wider frequency band thus adversely affecting carrier selectivity and interchannel interference. Consequently, VHF sources are generally synthesized from a highly stable frequency standard such as a precision crystal oscillator.

Crystal oscillator frequency synthesis may involve one or more precision crystal oscillators and a plurality of mixers, arranged to obtain and combine harmonics of the oscillators to make available a multiplicity of output signals harmonically related to the crystal oscillator sources. An undesirable concomitant of this method is the generation of spurious frequencies in the combining mixers. Selection of the desired frequency combination, while simultaneously rejecting undesired harmonics and spurious frequencies, is a difficult problem which requires highly selective filtering, the problem becoming more difficult as the channel frequency spacing is decreased. A filtering method to reject the undesired frequencies may comprise a phase lock loop wherein a voltage controlled oscillator (VCO) is referenced to a selected synthesized carrier frequency. In these loops, the VCO output frequency is generally fed through a narrow band filter, to reduce noise caused by spurious frequencies, and other sources, then to a phase detector wherein it is compared to the synthesized carrier frequency. Resulting error signals are applied from the phase detector through the lowpass filter to control and correct the frequency of the VCO and thereby provide a substantially spurious free output carrier. The bandwidth required for the elimination of spurious frequencies however, limits the acquisition range of the loop and consequently the synthesized carrier frequencies to which the VCO may be locked. What is desired is a loop that exhibits wideband acquisition and narrow band filter characteristics in-lock.

SUMMARY OF THE INVENTION

A frequency synthesizer filter constructed in accordance with the principles of the present invention includes, a phase lock loop, an out-of-lock phase detector, a means for widening the loop bandwidth when an out-of-lock condition is detected, a means for sweeping the VCO frequency by applying a ramp voltage to the VCO control when an out-of-lock condition is detected and a means for holding the ramp voltage when the lock-in condition is detected. The synthesized carrier signal and a VCO signal are coupled to the phase detector, the output signal of which is at a frequency that is the difference between the VCO and carrier signal frequencies. A signal representative thereof is coupled to a difference amplifier which in turn couples a tuning voltage to the VCO. When the loop is in a locked-in condition, the frequencies of the carrier and the VCO are substantially equal causing a substantially d.c. signal at the output terminals of the phase detector to be coupled to one terminal of the difference amplifier while another d.c. signal is coupled to the other terminal. The resulting d.c. output signal of the difference amplifier holds the frequency of the VCO to that of the synthesized carrier signal. A narrow band filter which substantially eliminates spurious frequencies on either side of the carrier is in the loop while the loop remains in this locked condition.

When the carrier frequency is altered, the signal coupled from the phase detector changes from the locked-in d.c. signal to an a.c. error signal having a frequency equal to the difference between the frequencies of the VCO and the carrier. This a.c. error signal is coupled to a bandwidth switch that is thereby activated to short out a narrow band filter, thus widening the bandwidth of the loop and facilitating signal acquisition. The error signal is also coupled to the out-of-lock detector thereby turning on a gated oscillator which in turn couples a square wave signal to a counter. The output terminals of the counter are coupled to a D/A converter which in turn couples a voltage, that increases as a step ramp function, to the difference amplifier. The amplified difference voltage between the step ramp function voltage and the phase detector output voltage provides the sweep voltage for the VCO. Wideband operation of the loop continues until a lock-in condition is achieved, at which time the bandwidth switch is deactivated, switching the narrow band filter back into the loop and a d.c. signal is coupled to the out-of-lock detector turning off the gated oscillator, thus stopping the counter which holds the count achieved to that point. This causes the step ramp voltage to be held at the voltage which tuned the VCO to within the lock-in range of the loop with the wideband filter active.

BRIEF DESCRIPTION OF THE DRAWINGS

The single FIGURE is a schematic diagram, partially in block form, of an active filter embodying the principles of the invention.

DESCRIPTION OF THE PREFERRED EMBODIMENTS

Referring to the FIGURE, a phase lock loop constructed in accordance with the principles of the present invention may include a phase detector 10, one input terminal 10a of which may be coupled to an external signal source (not shown) that generates a signal at a desired frequency, which may be corrupted by spurious signals and other noise components, a differential amplifier 11, one input terminal 11a of which is coupled to the output terminal 10b of the phase detector 10, the output terminal 11c of which is coupled to the input terminal 12a of a narrow band filter 12 and to one terminal 13a of a bandwidth switch 13. The output terminal 12b of narrow band filter 12 is coupled to a second terminal 13b of bandwidth switch 13 and to the input terminal 14a of a wideband filter 14, the output terminal 14b of which is coupled to a voltage controlled oscillator (VCO) 15, the output signal of which is coupled to a signal output terminal 16 and to a second input terminal 10c of phase detector 10. Output terminal 10b of phase detector 10 also couples to the input terminal 17a of out-of-lock detector 17, the output terminal 17b of which couples to oscillator gate 18 which in turn is coupled to a gated oscillator 21. The output terminal of the gated oscillator 21 is coupled to a counter 22, the output terminals of which are coupled to the input terminals of a digital-to-analog converter 23, the output terminal of which is coupled to the second input terminal 11b of differential amplifier 11.

When the signal coupled to the phase detector 10 from the VCO 15 possesses a frequency substantially equal to the frequency of the signal coupled to the phase detector 10 from the external signal source, the phase lock loop is in a lock-in condition and the output of the phase detector 10 is a d.c. signal that is coupled to the differential amplifier 11 and to out-of-lock detector 17. Out-of-lock detector 17, which may comprise a capacitor 26 coupled between the output terminal 10b of phase detector 10 and an amplifier 27 and a high pass filter 28 coupled between the amplifier 27 and the output terminal 17b, does not respond to the d.c. signal coupled from the phase detector 10, thus maintaining the output signal of the gate 18 at a level that prevents the oscillation of the gated oscillator 21. With the gated oscillator 21 inoperative, counter 22 maintains the count accumulated during the previous oscillation epoch. Maintenance of the count at the output terminals of counter 22 causes a d.c. voltage to be coupled from the D/A converter 23 to terminal 11b of the differential amplifier 11. Amplifier 11, by virtue of the coupling of d.c. voltages to input terminals 11a and 11b couples, a d.c. voltage to the input terminal 12a of narrow band filter 12, which may comprise a series resistor 31 coupled between input terminal 12a and output terminal 12b and a shunt resistor 32 coupled at one end thereof of output terminal 12b at the other end to ground via a shunt capacitor 33. D.C. current coupled to the input terminal 12a of narrow band filter 12 flows therethrough and is coupled from the output terminal 12b to the wideband filter 14 at the input terminal 14a thereof. Wideband filter 14 may comprise a series resistor 36 coupled between input terminal 14a and output terminal 14b and the series combination of resistors 37 and capacitor 38 which provides a shunt to ground from output terminal 14b. D.C. currents coupled to input terminal 14a of wideband filter 14 flow therethrough and are coupled from the output terminal 14b to the input terminal 15a of VCO 15. The value of the input impedance of VCO 15 is very much greater than the sum of the values of the resistors 31 and 36. Consequently, substantially the entire voltage at the output terminal 11c of amplifier 11 appears at the input terminal 15a of VCO 15 and substantially no voltage drop is experienced between the input terminal 12a and the output terminal 12b of the narrow band filter 12. Thus, bandwidth switch 13, which may comprise the parallel combination of oppositely polarized diodes 41 and 42 coupled between input terminal 13a and output terminal 13b is not activated. Under these conditions, the bandwidth of the loop is determined by the narrow band filter 12 and the spurious frequencies produced are limited thereby.

The advent of a step change in frequency of the signal at input terminal 10a causes a signal to appear at the output terminal 10b of phase detector 10 that has a frequency which is the difference between the frequency of the VCO signal and the frequency of the new input signal. This output signal is coupled to the input terminal 11a of amplifier 11 and to the input terminal 17a of out-of-lock detector 17. When the difference frequency exceeds the cut-off frequency of the high pass filter 28, a signal is coupled from the output terminal 17b to gate 18 which in turn couples a turn-on signal to the gated oscillator 21. Gate 18 may comprise a transistor 45 having its emitter grounded, its base coupled to output terminal 17b of out-of-lock detector 17, and its collector coupled to input terminal 21a of gated oscillator 21. Gated oscillator 21 may comprise an OR gate 46, one input terminal 46a of which is coupled to the input terminal 21a, the other input terminal 46b of which is coupled to node 47 which in turn is coupled via resistor 48 to the output terminal 46c of OR gate 46 and to the input terminal 49a of inverter 49 while the output terminal 49b of inverter 49 is coupled to node 47 via capacitor 52 and to the input terminal of counter 22. When a signal is coupled to the base of transistor 45 from the out-of-lock detector 17, transistor 45 is driven into saturation, causing a low level signal at the input terminal 46a of OR gate 46 which turns on the gated oscillator 21. A complete description of the operation of the gated oscillator 21 may be found in the RCA COS/MOS Integrated Circuits Manual, RCA Corporation, 1972, on pages 89 through 93. With each pulse from the oscillator 21, the output of the counter is increased one binary digit. The resulting binary count is coupled to the D/A converter 23, which may be of the ladder type well known in the art. The output signal from the D/A converter 23 is increased by a predetermined level with each binary digit increase at the output terminals of the counter 22. This level is held until the next pulse from oscillator 21 increases the binary output of the counter 22 by one digit.

This sequence of events causes a step ramp signal 53 to appear at the output terminal of the D/A converter 23. Each step in the step ramp output signal 53 is of a time duration $t_s$ that is determined by the period of oscillation of the gated oscillator 21 and is a function of the resistor 48 and the capacitor 52 combination. The height h of each step is a function of the modulus and supply voltage of the counter. The duration of the ramp $t_d$ is a function of the modulus and the oscillator period $t_s$. The step ramp function 53 is coupled to a second input terminal 11b of amplifier 11 thus providing a sweep voltage at the output terminal 11c that is the difference between the step ramp function 53 and the error signal coupled from the output terminal 10b of phase detector 10 to the input terminal 11a of differential amplifier 11. Since the sweep voltage is a time varying signal, a.c. current components exist at the output terminal 11c of the differential amplifier 11 which have shunt paths to ground via capacitors 33 and 38. These a.c. components cause a voltage drop across resistor 31 which forward-biases either diode 41 or 42. The combinations of resistors 31 and 32 and resistors 36 and 37 provide voltage dividers for the a.c. components which are added to the d.c. component of the sweep voltage to cause a signal representative of the sweep voltage to be coupled to the input terminal 15a of VCO 15, altering the frequency thereof until lock-in is achieved. When lock-in is achieved, the signal coupled from the output terminal 10b of phase detector 10 to the input terminal 17a of out-of-lock detector 17 is substantially a d.c.

signal. This d.c. signal causes a low level signal to be coupled from the output terminal 17b of the out-of-lock detector 17 to the base of transistor 45 driving transistor 45 to cut-off and establishing a high level signal at the collector thereof. This high level signal is coupled to the input terminal 46a of OR gate 46 which turns off the gated oscillator 21, locking the count of counter 22 and concomitantly fixing the level of the step ramp function 53, thus providing a d.c. signal at the input terminal 11b of differential amplifier 11. Since the signals at the input terminals 11a and 11b are d.c. signals, the output signal at terminal 11c is a d.c. signal that is equal to the difference between the two input d.c. signals. This d.c. signal, by virtue of the shunt capacitors 33 and 38, is caused to flow serially through resistors 31, 36 and the input impedance of VCO 15. Since as stated previously, the input impedance of VCO 15 is very much greater than the combined resistance value of resistors 31, and 36, substantially all of the difference voltage at the output terminal 11c of differential amplifier 11 appears across this input impedance and there is substantially no potential difference between the input terminal 12a and the output terminal 12b of the narrow band filter 12. Under these conditions, diodes 41 and 42 of bandwidth switch 13 cease to conduct and the narrow band filter 12 is reinserted in the loop.

Though the difference frequency at the output terminal 10b of phase detector 10 may vary over a relatively large band, the bandwidth of the amplifier 11 need not be of commensurate width. When the difference frequency is out of the band of amplifier 11, the signal at the output terminal 11c thereof is substantially a function of the step ramp signal 53. This output signal sweeps the VCO until the signal at the output terminal 10b of phase detector 10 is within the bandwidth of the amplifier 11, at which time the loop continues to operate in the wideband mode as described above until lock-in is achieved.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A phase lock loop with an acquisition bandwidth that is greater than the lock-in bandwidth comprising:
   a differential amplifier having a first input terminal, a second input terminal, and an output terminal at which a signal is coupled that is representative of the difference between the signal coupled to said first and second input terminals;
   oscillator means having an input terminal coupled to said output terminal of said differential amplifier for providing a signal at an output terminal thereof that is controlled in frequency by said signal at said output terminal of said differential amplifier;
   a phase detector having a first input terminal coupled to receive an external signal having a predetermined frequency, a second input terminal coupled to said output terminal of said controlled oscillator means, and an output terminal coupled to said first input terminal of said differential amplifier at which a signal is coupled that is representative of the difference in frequency between signals coupled to said first and second input terminals of said phase detector;
   a first filter, having an input terminal and an output terminal, serially coupled between said differential amplifier and said controlled oscillator means for passing signals having frequencies within a predetermined frequency band;
   a second filter coupled between said differential amplifier and said oscillator means in serial relationship with said first filter for passing signals having frequencies within a pre-specified frequency band that is wider than said predetermined frequency band of said first filter;
   means coupled between said input terminal and said output terminal of said first filter for switchably providing a direct path therebetween whenever said signal at said output terminal of said differential amplifier possesses a frequency that exceeds a specified bound; and
   means coupled between said output terminal of said phase detector and said second input terminal of said differential amplifier for providing a ramp signal whenever said signal at said output terminal of said phase detector exceeds a predetermined frequency and to hold said ramp signal at a value required to achieve lock-in when said switch means provides said direct path between said input and output terminals of said first filter.

2. A phase lock loop according to claim 1 wherein said switch means comprises two oppositely poled unidirectionally current conductive means coupled in parallel relationship between said input and output terminals of said first filter.

3. A phase lock loop according to claim 1 wherein said ramp signal means comprises:
   out-of-lock detector means having an input terminal coupled to said output terminal of said phase detector and an output terminal for providing a signal at said output terminal when said signal at said output terminal of said phase detector is at a frequency which is greater than a predetermined frequency;
   second oscillator means having an input terminal coupled to said output terminal of said out-of-lock detector means for providing an oscillating signal at an output terminal in response to said signal at said output terminal of said out-of-lock detector means; and
   means coupled between said output terminal of said second oscillator means and said second input terminal of said differential amplifier for converting said oscillating signal of said second oscillator means into said ramp signal.

4. The phase lock loop according to claim 3 further including gate means coupled between said output terminal of said out-of-lock detector means and said input terminal of said second oscillator means for providing a signal in response to said output signal of said out-of-lock detector means whereby said second oscillator means is caused to commence oscillation.

5. A phase lock loop according to claim 3 wherein said converter means includes:
   means having an input terminal coupled to said output terminal of said second oscillator means for providing a binary count of elapsed oscillator periods of said oscillating signal of said second oscillator means; and
   means coupled to receive said binary count for providing said ramp function in response thereto and having an output terminal coupled to said second input terminal of said differential amplifier.

6. A phase lock loop in accordance with claim 4 wherein said out-of-lock detector means comprises:
  means having an input terminal coupled to said output terminal of said phase detector and an output terminal for amplifying a.c. signals coupled from said output terminal of said phase detector; and
  high pass filter means responsive to signals coupled from said amplifier means for providing signals to said gate means when a signal at said output terminal of said amplifier means exceeds a predetermined frequency.

7. A phase lock loop in accordance with claim 6 wherein said switch means comprises two oppositely poled unidirectional current conductive means coupled in parallel relationship between input and output terminals of said first filter.

8. A phase lock loop according to claim 7 wherein said converter means includes:
  means having an input terminal coupled to said output terminal of said second oscillator means for providing a binary count of elapsed oscillator periods of said responsive oscillating signals; and
  means coupled to receive said binary count for providing said ramp function in response thereto at an output terminal which is coupled to said second input terminal of said differential amplifier.

9. A phase lock loop having a predetermined limited acquisition bandwidth for acquiring a selectable narrow bandwidth output signal from a wide bandwidth input signal greater than said predetermined bandwidth and thereafter locking on said selected narrow bandwidth signal thereby suppressing spurious frequencies from said output signal, the combination comprising:
  a phase detector responsive to said wide band input signal and a voltage controlled oscillator means having its output coupled with said phase detector for providing at the output of said phase detector a control signal having a frequency proportional to the frequency difference between said input signal and said oscillator output,
  wide band and narrow band filter means responsive to said control signal for controlling said oscillator means, said narrow band filter and said wide band filter passing said control signal when the same corresponds to said selectable bandwidth signal, and said wide band filter passing said control signal when the same corresponds to said predetermined acquisition bandwidth,
  means for shunting said narrow bandwidth filter means when said control signal bandwidth exceeds its bandpass characteristic,
  an out-of-lock detector means responsive to said control signal for providing a ramp signal having amplitude values sufficient to sweep the oscillator means over the bandwidth of said wide band input signal,
  means responsive to said ramp signal and said control signal for controlling said oscillator means, and
  further means responsive to said out-of-lock detector means for clamping said ramp signal when its amplitude value corresponds to the bandwidth of said wide band filter means.

* * * * *